United States Patent
Rauhala

(10) Patent No.: US 6,564,043 B2
(45) Date of Patent: *May 13, 2003

(54) METHOD AND ARRANGEMENT FOR LINEARIZING A RADIO RECEIVER

(75) Inventor: Antti Heikki Tapani Rauhala, Muurla (FI)

(73) Assignee: Nokia Mobile Phones Limited, Espoo (FI)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/433,230

(22) Filed: Nov. 4, 1999

(65) Prior Publication Data

US 2003/0045243 A1 Mar. 6, 2003

(30) Foreign Application Priority Data

Nov. 6, 1998 (FI) .................................................. 982409

(51) Int. Cl.$^7$ ................................................ H04B 1/00
(52) U.S. Cl. ................ 455/251.1; 455/67.1; 455/226.2; 455/250.1
(58) Field of Search .......................... 455/232.1, 234.1, 455/234.2, 245.2, 246.1, 247.1, 250.1, 251.1, 252.1, 253.2, 63, 67.1, 226.1, 226.2, 226.3, 226.4, 343, 574; 375/345; 379/413

(56) References Cited

U.S. PATENT DOCUMENTS

| | | | |
|---|---|---|---|
| 4,947,141 A | | 8/1990 | Atkinson et al. ............. 331/135 |
| 5,001,776 A | * | 3/1991 | Clark ........................ 455/234.1 |
| 5,239,683 A | * | 8/1993 | Usui ............................. 455/63 |
| 5,339,454 A | * | 8/1994 | Kuo et al. ................. 455/247.1 |
| 5,481,226 A | | 1/1996 | Parkes, Jr. .................... 330/279 |
| 5,483,691 A | * | 1/1996 | Heck et al. ............... 455/234.2 |
| 5,627,857 A | * | 5/1997 | Wilson ........................ 375/345 |
| 5,661,794 A | * | 8/1997 | Rosch et al. ................. 379/413 |
| 5,722,062 A | * | 2/1998 | Nakanishi et al. ......... 455/247.1 |
| 5,758,271 A | * | 5/1998 | Rich et al. ................ 455/234.1 |
| 6,078,797 A | * | 6/2000 | Kashimura ............... 455/234.1 |
| 6,226,504 B1 | * | 5/2001 | Takagi ...................... 455/234.1 |

FOREIGN PATENT DOCUMENTS

EP 0829954 A1 3/1998

OTHER PUBLICATIONS

Japanese Patent Abstract No. JP 60062246.
"A Software Radio Architecture For Linear Multiuser Detection", Seskar et al., IEEE Journal on Selected Areas In Communications, vol. 17, No. 5, May 1999, pp. 814–823.

* cited by examiner

Primary Examiner—Quochien Vuong
(74) Attorney, Agent, or Firm—Perman & Green, LLP

(57) ABSTRACT

The invention pertains to a method and an arrangement for linearizing a radio receiver (20). The invention is advantageously applied in the reception circuits of mobile stations. A receiver according to the invention monitors the signal strength on the receive channel and its neighboring channels. In addition, the receiver can determine the quality of the detected signal by calculating its bit error ratio or signal-to-noise ratio. In normal conditions, i.e. when the signal strength is satisfactory on the receive channel and normal on the neighboring channels, the supply currents of the front-end amplifiers (A1, A2) and at least the first mixer (M1) of the receiver are kept relatively small. If the signal strength on the receive channel goes below a predetermined value or, on a neighboring channel, exceeds a predetermined value, said supply currents are increased. This may happen also if the bit error ratio or signal-to-noise ratio reaches a predetermined limit. The supply currents may be adjusted in one or more steps.

24 Claims, 3 Drawing Sheets

METHOD AND ARRANGEMENT FOR LINEARIZING A RADIO RECEIVER

CROSS-REFERENCES TO RELATED APPLICATIONS

Not Applicable

STATEMENT REGARDING FEDERALLY SPONSORED RESEARCH OR DEVELOPMENT

Not Applicable

BACKGROUND OF THE INVENTION

1. Field of the Invention

Figure 1:
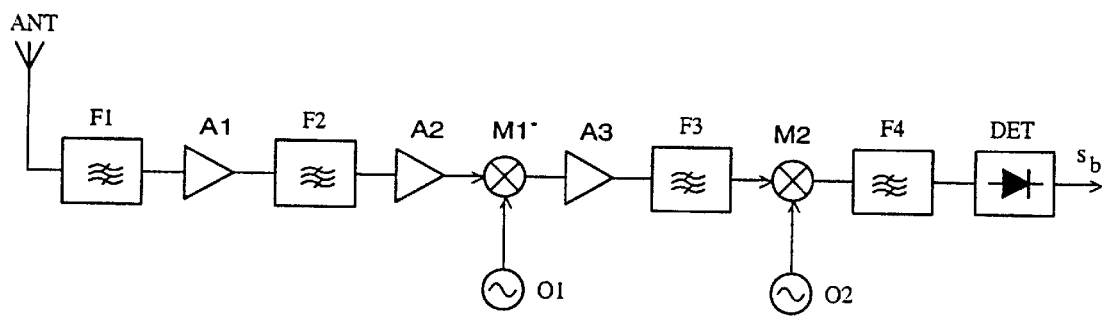

The invention relates to a method and an arrangement for linearizing a radio receiver. The invention can be advantageously applied in the reception circuits of mobile stations.

2. Description of the Related Art Including Information Disclosed Under 37 C.F.R 1.97 and 1.98.

The quality of a signal in a radio receiver is degraded by noise and interference added to the signal on the transmission path, noise in the reception circuitry, as well as by noise and interference indirectly caused by other radio signals. The latter refers to a situation in which a signal on a neighboring channel, which momentarily is considerably stronger than the signal to be received, shifts the operating point of the high-frequency amplifier and/or mixer towards non-linearity and saturation. This degrades the signal-to-noise ratio at the amplifier output. In the mixer the increase of non-linearity will intensify intermodulation products and, thus, increase the overall noise and interference level.

A basic method for reducing noise and interference is filtering, which takes place in all receivers in many stages of operation and which will not be discussed further in this description. Rather, we will discuss the widening of the linear range of amplifiers and mixers as a means of reducing noise and interference. The linear range gets wider as the operating voltage is increased or, if the operating voltage remains unchanged, as the supply current is increased. So, the signal quality can be improved by using more energy in the receiver. In the prior art, said circuits are specified such that the signal quality requirements will be met even in poor noise and interference conditions. A disadvantage of this method, as regards portable devices, is that it requires a relatively large supply of energy and, therefore, shortens the battery life.

From the prior art it is also known a method in which the strength of the received signal is monitored and the supply current of the mixer is increased if the strength of the signal drops. An advantage of the method is that it improves the quality of the signal and reduces intermodulation products if the field received is weak. A disadvantage, however, is that the supply current will be increased even if the receiver received no other, interfering, signals. Moreover, the amplifiers have to be rated for the worst case, which results in a relatively large continuous current consumption in the amplifiers.

The object of the invention is to reduce the aforementioned disadvantages related to the prior art.

BRIEF SUMMARY OF THE INVENTION

The basic idea of the invention is as follows: A receiver monitors the signal strength on the receive channel and neighboring channels. In addition, the receiver can determine the quality of the detected signal by calculating its bit error ratio or signal-to-noise ratio. In normal conditions, i.e. when the signal strength is satisfactory on the receive channel and ordinary on the neighboring channels, the supply currents of the receiver's front-end amplifiers and at least the first mixer are kept relatively low. If the signal strength goes below a certain value on the receive channel or exceeds a certain value on a neighboring channel, said supply currents are increased. This may happen also if the bit error ratio or signal-to-noise ratio deteriorates down to a certain limit. Adjustment of the supply currents may take place in one or more steps.

The advantage of the invention is that the energy consumption of the receiver can be reduced without degrading the signal quality. This means longer life for the battery or, if the life of the battery is kept unchanged, that a smaller battery can be used. If the mean energy consumption is kept the same as in receivers of the prior art, the advantage is a better signal quality.

The method according to the invention for linearizing a radio receiver in a signal chain in which a signal received from an antenna is amplified and the amplified signal is detected, and the received signal is processed by at least one linear unit is characterized in that at least one quality factor of the detected signal is measured, and the supply current of said at least one linear unit is controlled on the basis of the measurement results.

The arrangement according to the invention for linearizing a radio receiver comprising means for detecting a received signal and at least one linear unit with current supply circuits for processing the received signal is characterized in that it comprises means for measuring at least one quality factor of the detected signal, and means for controlling the linear unit's supply current on the basis of the measurement results.

BRIEF DESCRIPTION OF THE SEVERAL VIEWS OF THE DRAWING(S)

Preferred embodiments of the invention are disclosed in the dependent claims.

Figure 3:
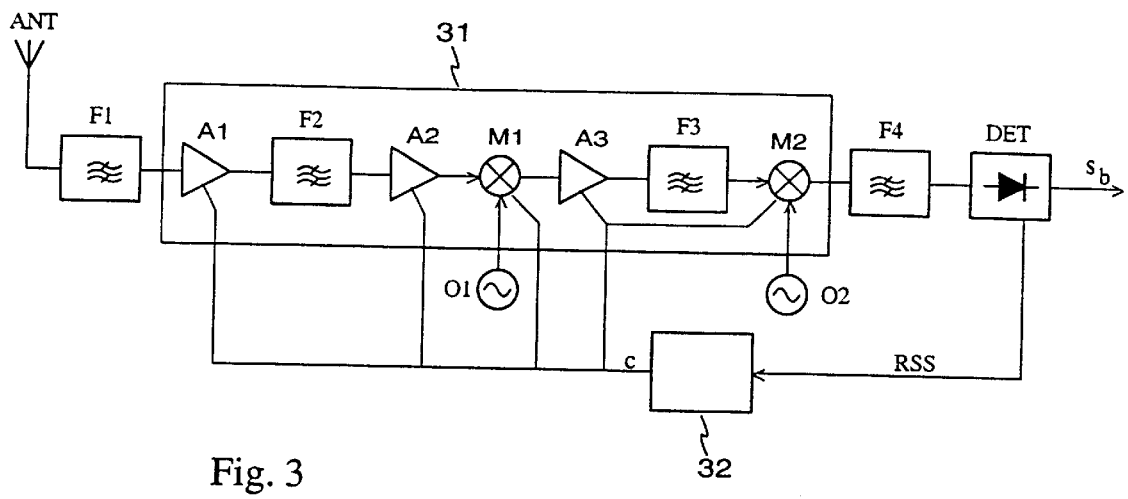
Figure 4:
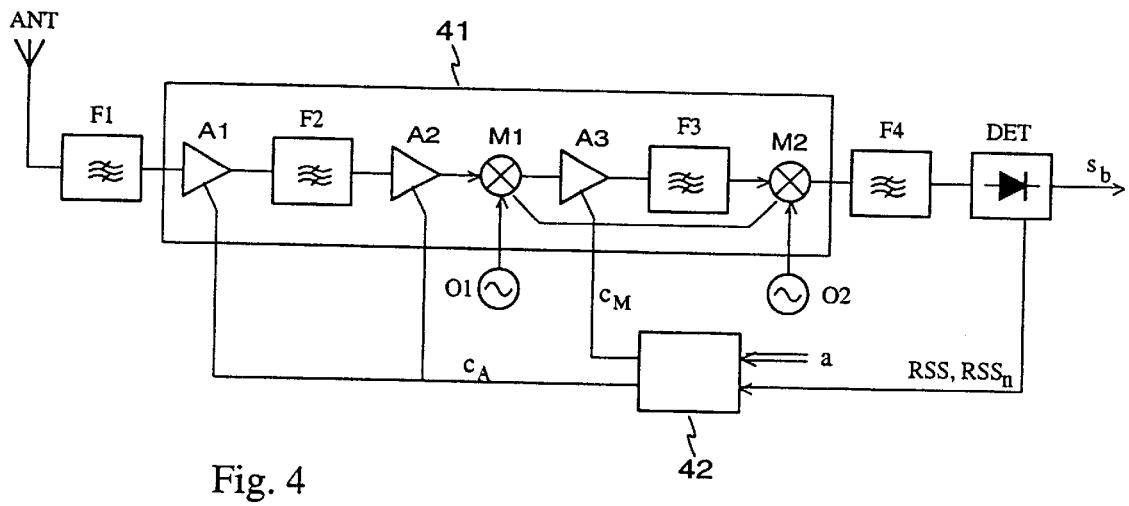
Figure 5:
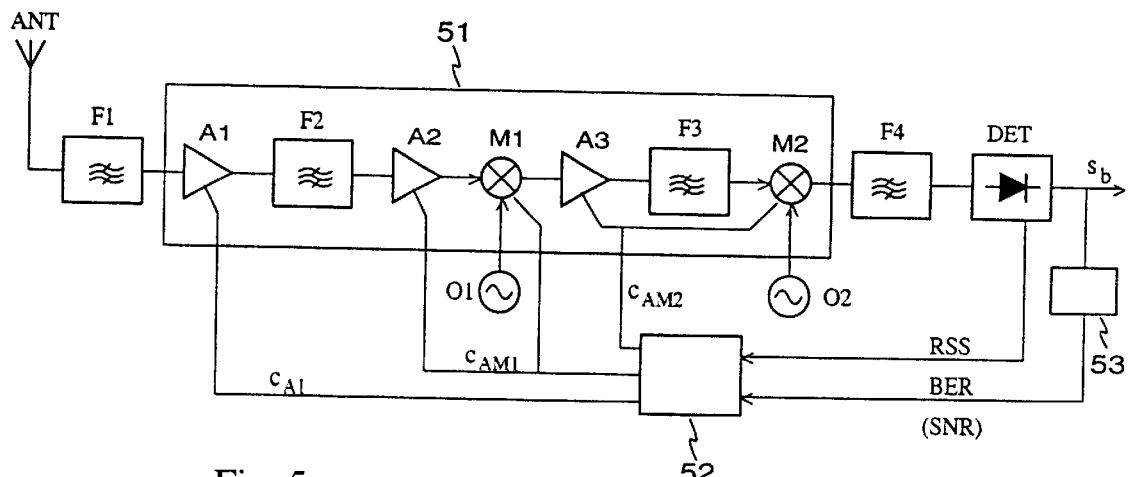
Figure 6:
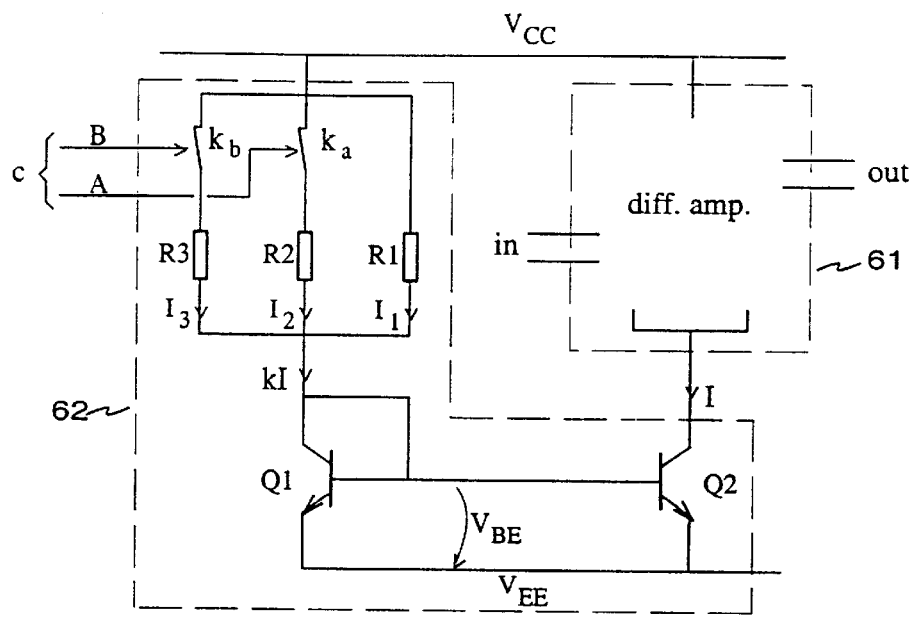
Figure 7:
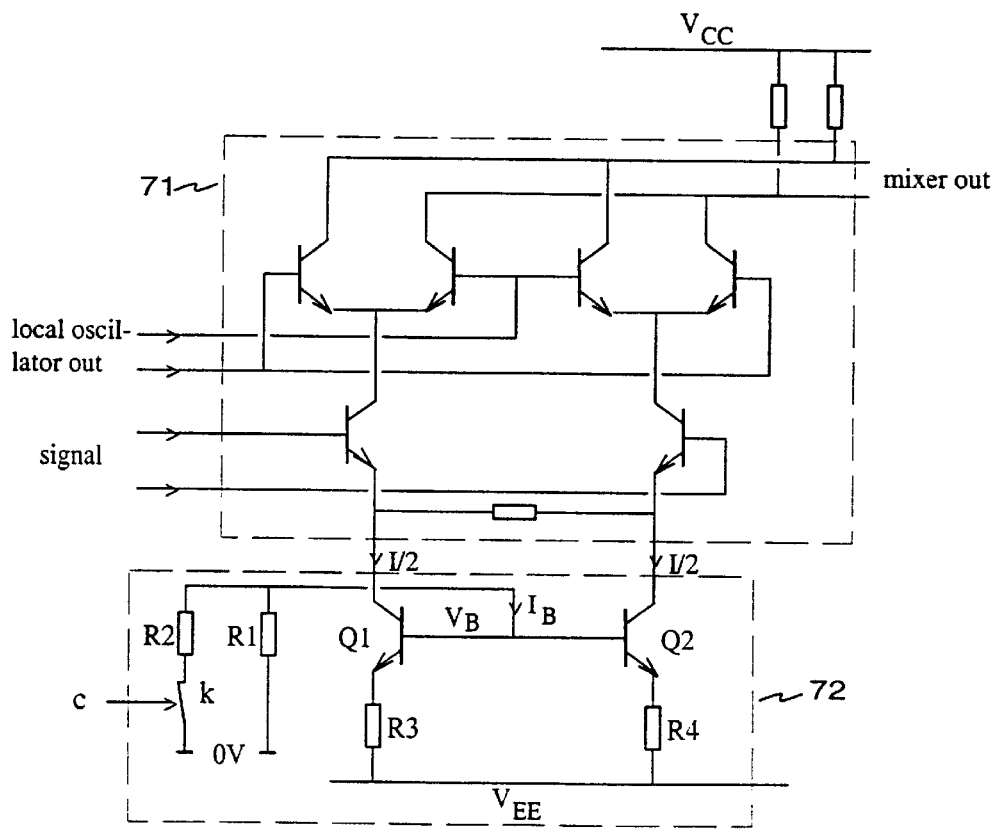

The invention will now be described in detail. Reference will be made to the accompanying drawings wherein FIG. 1 is a block diagram of a typical radio receiver according to the prior art, FIG. 2 shows the structure of FIG. 1 supplemented with a functional block according to the invention, FIG. 3 shows an example of supply current control according to the invention, FIG. 4 shows a second example of supply current control according to the invention, FIG. 5 shows a third example of supply current control according to the invention, FIG. 6 shows an example of amplifier supply current control according to the invention, and FIG. 7 shows an example of mixer supply current control according to the invention.

DETAILED DESCRIPTION OF THE INVENTION

FIG. 1 is a simplified example of a radio receiver without the low-frequency components. An antenna ANT is coupled to a duplex filter F1, which is needed e.g. in mobile phones. Filter F1 is coupled to a low-noise pre-amplifier A1. Amplifier A1 is coupled to a channel selector filter F2 in the tuner, and filter F2 is coupled to an amplifier A2. The output of amplifier A2 is coupled to the first input of a first mixer M1. The second input of mixer M1 is connected with a local oscillator O1. The output of mixer M1 is coupled to an amplifier A3, and the output of the latter is coupled to a first intermediate frequency (IF) filter F3. The output of filter F3 is coupled to the first input of a second mixer M2. The second input of mixer M2 is connected with a second local oscillator O2. The output of mixer M2 is coupled to a second IF filter F4 and the output of the latter to a detector DET. Detector DET provides a baseband signal $s_b$. The amplifiers and mixers in the receiver are in this description and particularly in the claims called "linear units". In the ideal case they operate in a totally linear manner in all situations. In practice, non-linearity is present in their operation which causes signal degradation. The higher the signal levels to be processed, the more there is non-linearity in the operation of the linear units.

Figure 2:
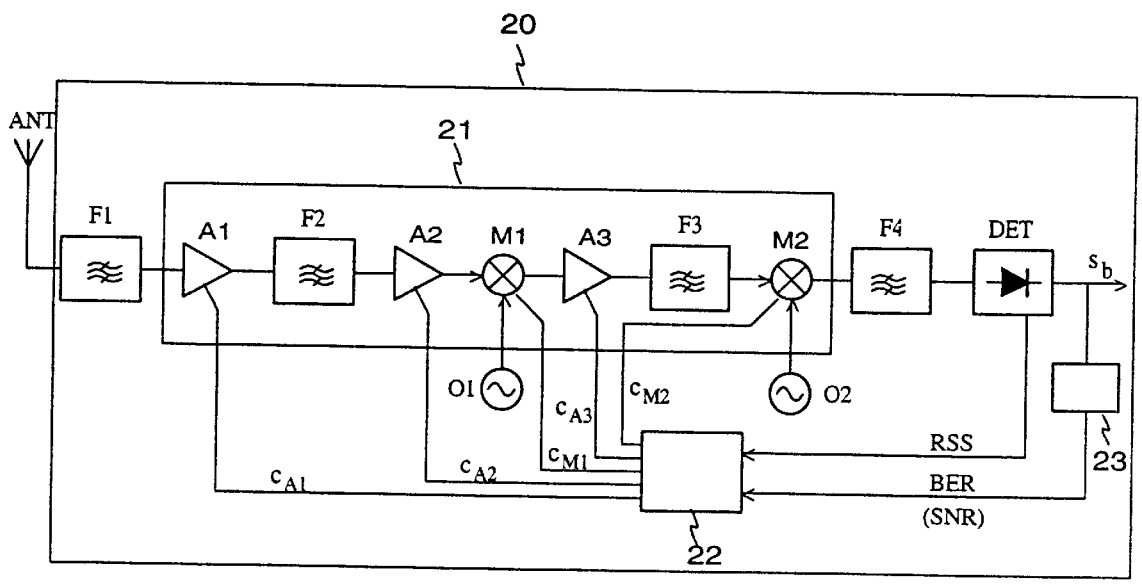

FIG. 2 shows a similar signal path structure as FIG. 1. Unit 21 includes the linear units, or amplifiers A1, A2 and A3 as well as mixers M1 and M2. What is additional to FIG. 1 is a control unit 22 according to the invention for controlling the supply currents of the linear units. Detector DET provides information about the signal strength (RSS) on the channel to which the receiver is tuned. In the example of FIG. 2 the transmitted signal is digital. Unit 23 calculates the bit error ratio (BER) that describes the quality of the received and detected signal $s_b$. The operation of unit 23 may be realized in the form of a computer program. Signals RSS and BER are taken to the control unit 22 the outputs of which are coupled to the linear units. Control signal $c_{A1}$ sets the supply current of amplifier A1. Similarly, signal $c_{A2}$ sets the supply current of amplifier A2, signal $c_{M1}$ that of mixer M1, signal $c_{A3}$ that of amplifier A3, and signal $c_{M2}$ that of mixer M2.

Alternatively, the quality of the detected signal can be determined by calculating its signal-to-noise ratio. In that case, unit 23 provides signal SNR (signal-to-noise ratio).

FIG. 3 relates to a simple example of supply current control for the linear units. A control unit 32 only receives the receive signal strength RSS information which has threshold values S31 and S32. The control unit 32 produces one one-bit control signal c, which is taken to all linear units A1, A2, M1, A3 and M2. The supply current of a given linear unit has two values. Supply currents are controlled with signal c according to the table below.

| RSS | c | $I_i$ |
|---|---|---|
| ≦S31 | 0 | $I_{ih}$ |
| >S31, <S32 | 1 | $I_{il}$ |
| ≧S32 | 0 | $I_{ih}$ |

Subindex I refers to a linear unit. $I_{il}$ stands for the lower supply current value of the linear unit and $I_{ih}$ for the higher supply current value. When the signal strength RSS is not more than S31, signal c is 0 and the linear unit supply currents are at their higher values. The relatively large supply currents help reduce the effects of possible interference from outside the receive channel. When the signal strength RSS is between S31 and S32, signal c is 1 and the supply currents are at their lower values. The relatively small supply currents help reduce energy consumption. When the signal strength is at least S32, signal c is 0 and the supply currents are again at their high values. Increasing the supply currents this way prevents the operating points of the linear units from shifting into the non-linear region when there is an exceptionally strong signal on the receive channel.

FIG. 4 relates to a second example of supply current control for the linear units. A control unit 42 receives from detector DET an indication about either the receive channel signal strength RSS or the strength of any signal on the reception band. Signal a from the receiver's tuner control indicates the channel. Signal RSS has one threshold value S4 which corresponds to a relatively low receive signal strength. Signal $RSS_n$ also has one threshold value Sn, which corresponds to a relatively high signal strength on the channel. The control unit 42 provides two one-bit control signals $c_A$ and $c_M$. Signal $c_A$ is 0 when signal RSS is greater than S4 and signal $RSS_n$ is at the same time smaller than Sn. Otherwise, signal $c_A$ is 1. Signal $c_A$ is taken to amplifiers A1 and A2. Signal $c_M$ is 1 when signal RSS is not greater than S4 and signal $RSS_n$ is at the same time at least Sn. Otherwise, signal $c_M$ is 0. Signal $c_M$ is taken to mixer M1, amplifier A3 and mixer M2. If signal $c_A$ or signal $c_M$ is 0, the supply current in the linear unit in question is lower, and, conversely, if signal $c_A$ or $c_M$ is 1, the supply current is higher. Thus, the linear unit supply currents are controlled according to the table below. $RSS_n$ stands for the signal strength of the neighboring channel in which the signal strength is greater. Subindex A refers to linear units A1 and A2, and subindex M to linear units M1, A3 and M2. Subindex I refers to the lower supply current of the linear unit, and subindex h to the higher supply current. For example, $I_{M1}$ means that the control current in mixers M1 and M2 and in amplifier A3 is set to the lower value.

| $RSS_n$ | RSS | $I_A$ | $I_M$ |
|---|---|---|---|
| <Sn | >S4 | $I_{Al}$ | $I_{Ml}$ |
| <Sn | ≦S4 | $I_{Ah}$ | $I_{Ml}$ |
| ≧Sn | >S4 | $I_{Ah}$ | $I_{Ml}$ |
| ≧Sn | ≦S4 | $I_{Ah}$ | $I_{Mh}$ |

When the signal strength on the receive channel is normal or relatively high, and on the neighboring channels normal or relatively low, all linear unit supply currents are set to the lower values. When the signal strength on the receive channel drops relatively low, the supply currents of the front-end amplifiers A1 and A2 are increased. When the signal strength on the receive channel is at least normal, but relatively high on a neighboring channel, the supply currents of amplifiers A1 and A2 are set to the higher values and the supply currents of the other linear units to the lower values. When the signal strength on the receive channel is relatively low and on a neighboring channel relatively high, the supply currents of all linear units are set to the higher values.

FIG. 5 relates to a third example of supply current control for the linear units. A control unit 52 receives a receive channel signal strength indication RSS and receive channel bit error ratio indication BER. Signal RSS has two threshold values S51 and S52. Signal BER also has two threshold values E1 and E2. The control unit provides three supply current control signals $c_{A1}$, $c_{AM1}$ and $c_{AM2}$. Signal $c_{A1}$ has two bits and is taken to amplifier A1. So, the supply current of amplifier A1 may take four values. Signal $c_{AM1}$ also has two bits and is taken to amplifier A2 and mixer M1. So, the supply currents of these units may take four values each. Signal $c_{AM2}$ has one bit and is taken to amplifier A3 and mixer M2. So, the supply currents of these units may take two values each. The logic operation of the control unit 52 is arranged such that the supply current control for the linear units is in accordance with the table below, for example. For simplicity, supply current values are denoted by just numbers on the right-hand side of the table. Number 1 means the lowest supply current values, number two the second lowest values, number 3 the third lowest values and number 4 the highest supply current values.

| RSS | BER | $I_{A1}$ | $I_{A2}$ and $I_{M1}$ | $I_{A3}$ and $I_{M2}$ |
|---|---|---|---|---|
| >S51 | <E1 | 1 | 1 | 1 |
| >S51 | >E1, <E2 | 3 | 2 | 1 |
| >S51 | >E2 | 4 | 4 | 2 |
| <S51, >S52 | <E1 | 2 | 1 | 1 |
| <S51, >S52 | >E1, <E2 | 3 | 2 | 1 |
| <S51, >S52 | >E2 | 4 | 4 | 2 |
| <S52 | <E1 | 2 | 2 | 1 |
| <S52 | >E1, <E2 | 3 | 3 | 2 |
| <S52 | >E2 | 4 | 4 | 2 |

When the signal strength RSS on the receive channel is normal, i.e. greater than S51, and the bit error ratio BER relatively low, the supply currents of all linear units are kept relatively small. When the bit error ratio is relatively high, i.e. greater than threshold value E2, the supply currents of all linear units are set to the maximum values regardless of the signal strength value. If the bit error ratio is high even though the signal strength on the receive channel is normal, the probable cause is an exceptionally strong signal on a neighboring channel, so that there is a special reason to improve the linearity of the linear units. The rest of the nine cases shown on the table fall between these cases. For example, row 5 of the table depicts a case in which the signal strength is somewhat smaller than normal and the bit error ratio is somewhat greater than normal. The supply current of the first amplifier A1 is thereby set to the second highest value, the supply currents of amplifier A2 and mixer M1 are set to the second smallest values, and the supply currents of amplifier A3 and mixer M2 are set to the smallest values. Naturally, suitable lag is arranged in the operation of the control unit 52 lest oscillatory phenomena occur in the control process.

FIG. 6 shows an example of a linear unit's supply current control. In this example the linear unit 61 is an amplifier realized by a differential pair. The supply current control circuit 62 comprises transistors Q1 and Q2, resistors R1, R2 and R3, as well as switches $k_a$ and $k_b$. Switch $k_a$ is in series with resistor R2 and switch $k_b$ is in series with resistor R3. Both series connections are coupled in parallel with resistor R1. One end of the whole parallel connection, which thus has three branches, is coupled to the higher power supply voltage $V_{CC}$ terminal of the voltage supply and the other end to the collector of transistor Q1. The collector and base of transistor Q1 are coupled together and the emitter is coupled to the lower power supply voltage $V_{EE}$ terminal of the voltage supply. The collector of transistor Q2 is coupled to amplifier 61 so that the total current I of the transistors in the amplifier is brought to the collector. The base of transistor Q2 is coupled to the base of transistor Q1 and the emitter of transistor Q2 is coupled to the emitter of transistor Q1. Thus, transistor Q2 has the same control voltage $V_{BE}$ as transistor Q1. If the transistors were identical, their collector currents would be equal as well. From the point of view of conservation of energy, transistor Q1 is advantageously manufactured such that its collector current kI is considerably smaller than the collector current I of transistor Q2. So, the transistor pair Q1, Q2 serves as a current amplifier, the current gain 1/k being 10, for example. In the aforementioned three-branch parallel connection the current of resistor R1 is $I_1$, the current of resistor R2 is $I_2$ and the current of resistor R3 is $I_3$. Thus the current kI of transistor Q1 is the sum $I_1+I_2+I_3$. Current $I_2$ is zero if switch $k_a$ is open, and current $I_3$ is zero if switch $k_b$ is open. Switches $k_a$ and $k_b$ are controlled with a two-bit digital signal c=AB. When bit A is 0, switch $k_a$ is open, and when bit A is 1, switch $k_a$ is closed. Correspondingly, bit B determines the status of switch $k_b$. The control for the total current kI is thus in accordance with the table below. The supply current I of amplifier 61 follows current kI according to the description above.

| B | A | kI | kI/$I_1$ |
|---|---|---|---|
| 0 | 0 | $I_1$ | 1 |
| 0 | 1 | $I_1 + I_2$ | 2 if R1 = R2 |
| 1 | 0 | $I_1 + I_3$ | 3 if R1 = 2 · R3 |
| 1 | 1 | $I_1 + I_2 + I_3$ | 4 if R1 = R2 = 2 · R3 |

In FIG. 6, the supply current control circuit 62 is realized with bipolar transistors. A corresponding structure may naturally be realized using MOS (Metal Oxide Semiconductor) transistors, for example. The circuit realized with transistors Q1 and Q2 as well as other circuits operating on the same principle are called "current mirrors" in the claims.

FIG. 7 shows another example of controlling a linear unit's supply current. In this case, the linear unit 71 is an analog multiplier used as a mixer: It receives a RF or IF signal and a subcarrier from a local oscillator. The mixer produces a signal the spectrum of which includes the spectrum of the input signal shifted both upwards and down. The control circuit 72 for the supply current I of the analog multiplier 71 comprises transistors Q1 and Q2, resistors R1 and R2 as well as switch k. The collector of transistor Q1 is coupled to the first branch of the analog multiplier 71, and the collector of transistor Q2 is coupled to the second branch of the analog multiplier. The emitter of transistor Q1 and the emitter of transistor Q2 are both coupled to the negative voltage $V_{EE}$ terminal of the voltage supply, the first via a resistor the resistance of which is relatively low, and the latter via resistor R4. The bases of transistors Q1 and Q2 are coupled to one another. When the resistances of resistors R3 and R4 are identical and transistors Q1 and Q2 are identical, the collector currents of the transistors are also identical, i.e. half of the analog multi-plier's 71 supply current I. Resistor R2 and switch k are coupled in series, and this series connection is coupled in parallel with resistor R1. One end of the parallel connection is coupled to signal ground and the other end to the bases of transistors Q1 and Q2. Switch k is controlled with a one-bit digital signal c. When signal c is 0, switch k is open and the control current $I_B$ of transistors Q1 and Q2 is $V_B$/R1, where $V_B$ is the transistors' base voltage. When signal c is 1, switch k is closed and the control current $I_B$ is $V_B$/R1+$V_B$/R2. Thus, the control current $I_B$ increases, causing the supply current I to increase as well. Desired values for the supply current I can be achieved by choosing suitable resistances for resistors R1, R2, R3 and R4. Naturally, a current mirror structure could also be used for controlling the mixer supply current.

Above it was described techniques according to the invention for controlling the supply currents of linear units in a radio receiver. The invention is not limited to the cases described. The number of linear units to be controlled may vary. Direct sampling does not have any mixers as such. In that case the supply current of analog-to-digital converter can be controlled.

In that case, the supply current of the detector can be controlled. The number of values set for a particular supply current may vary. The manner in which the degradation of the received signal is taken into account in the control of supply currents may vary greatly. The inventional idea can be applied in numerous ways within the scope defined by the independent claims.

What is claimed is:

1. A method for linearizing a radio receiver in a signal chain wherein
   a signal received from an antenna is amplified and the amplified signal is detected, and
   the received signal is processed by at least one linear unit, characterized in that
   a strength of the received signal is measured for achieving a first measurement result;
   at least one quality factor of the received detected signal is measured for achieving a second measurement result,
   a supply current supplying operating power from a power supply to said at least one linear unit is controlled on the bases of the first and second measurement results, and
   said at least one linear unit is supplied with a fixed supply voltage.

2. The method of claim 1, characterized in that a receive channel signal strength is measured as a quality factor of the detected signal.

3. The method of claim 2, characterized in that the supply current of at least one linear unit is increased if the signal strength on the receive channel goes below a predetermined threshold value.

4. The method of claim 3, characterized in that at least two threshold values are specified for the signal strength on the received channel.

5. The method of claims 3, characterized in that at least three settings are specified for the supply current of at least one linear unit.

6. The method of claim 1, characterized in that a signal strength of at least one other channel than the receive channel is measured as a quality factor of the detected signal.

7. The method of claim 6, characterized in that the supply current of at least one linear unit is increased if the signal strength on said other channel exceeds a predetermined threshold value.

8. The method of claim 1, characterized in that said measurement of at least one quality factor of the detected signal includes a step in which a bit error ratio (BER) is calculated for the signal.

9. The method of claim 8, characterized in that the supply current of at least one linear unit is increased if the bit error ratio on the receive channel exceeds a predetermined threshold value.

10. The method of claim 9, characterized in that at least two threshold values are specified for the receive channel bit error ratio.

11. The method of claim 1, characterized in that said measurement of at least one quality factor of the detected signal includes a step in which a signal-to-noise ratio is calculated for the signal.

12. The method of claim 11, characterized in that the supply current of at least one linear unit is increased if the signal-to-noise ratio on the receive channel goes below a predetermined threshold value.

13. The method of claim 12, characterized in that at least two threshold values are specified for the receive channel signal-to-noise ratio.

14. The method of claim 1, characterized in that the supply current of a linear unit is controlled steplessly.

15. An arrangement for linearizing a radio receiver which comprises means for detecting a received signal and at least one linear unit with current supply circuits for processing the received signal, characterized in that it comprises
    means for measuring a strength of the received signal to achieve a first measurement result,
    means for measuring at least one quality factor of the received detected signal for achieving a second measurement result,
    means for controlling the linear unit's supply current supplying operating power from a power supply to said linear unit on the basis of the first and second measurement results, and
    said at least one linear unit is supplied with a fixed supply voltage.

16. The arrangement of claim 15, characterized in that the means for measuring at least one quality factor of the detected signal comprises means for measuring the signal strength on any channel.

17. The arrangement of claim 15, characterized in that the means for measuring at least one quality factor of the detected signal comprises means for calculating a bit error ratio.

18. The arrangement of claim 15, characterized in that the means for measuring at least one quality factor of the detected signal comprises means for calculating a signal-to-noise ratio.

19. The arrangement of claim 15, characterized in that the means for controlling the linear unit's supply currents comprises a separate logic unit.

20. The arrangement of claim 15, characterized in that the means for controlling the linear unit's supply currents comprises a program running in the processor of the receiver.

21. The arrangement of claim 15, characterized in that the means for controlling the linear unit's supply currents comprises an analogically controllable current source.

22. The arrangement of claim 21, characterized in that said current source comprises a current mirror.

23. The arrangement of claim 15, characterized in that the means for controlling the linear unit's supply currents comprises a digitally controllable current source.

24. The arrangement of claim 15, characterized in that the means for controlling the linear unit's supply currents comprises an analog amplifier unit.

* * * * *